(12) United States Patent
McIntyre et al.

(10) Patent No.: US 7,224,458 B2
(45) Date of Patent: May 29, 2007

(54) PHASE-SHIFTING TEST MASK PATTERNS FOR CHARACTERIZING ILLUMINATION POLARIZATION BALANCE IN IMAGE FORMING OPTICAL SYSTEMS

(75) Inventors: Gregory R. McIntyre, El Cerrito, CA (US); Andrew R. Neureuther, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 11/357,803

(22) Filed: Feb. 16, 2006

(65) Prior Publication Data

US 2006/0187451 A1  Aug. 24, 2006

Related U.S. Application Data

(60) Provisional application No. 60/654,346, filed on Feb. 18, 2005.

(51) Int. Cl.
*G01J 4/00* (2006.01)
(52) U.S. Cl. ...................................... 356/364
(58) Field of Classification Search .............. None
See application file for complete search history.

(56) References Cited

U.S. PATENT DOCUMENTS 5,661,560 A * 8/1997 Ozaki .......................... 356/364
5,764,363 A * 6/1998 Ooki et al. ................... 356/364

OTHER PUBLICATIONS

McIntyre and Neureuther, "*Characterizing Illumination Angular Uniformity with Phase-Shifting Masks*", Optical Microlithography XVI. Edited by Yen, Anthony. Proceedings of the SPIE, vol. 5040, pp. 162-170 (Feb. 25, 2003).

McIntyre and Neureuther, "*Interferometric-Probe Monitors for Self-Diagnostics of Phase-Shifting Mask Performance*", 23rd Annual BACUS Symposium on Photomask Technology. Edited by Kimmel, Kurt R.; Staud, Wolfgang. Proceedings of the SPIE, vol. 5256, pp. 1324-1330 (Sep. 9, 2003).

McIntyre and Neureuther, "*Linear Phase Ring Illuminator Monitor*", J. Vac. Sci. Tech, May 28, 2003.

Van Den Broeke, "*Transferring Phase-Shifting Mask Technology into Mainstream Manufacturing*", Downloaded from: http://www.semiconductorfabtech.com/features/lithography/articles/body5.225.php3 on Oct. 22, 2004, 7 pages.

McIntyre and Neureuther, "*Monitoring Polarization and High-Numerical Aperatyre with Phase Shifting Masks: Radial Phase Grading*," J. Vac. Sci. Technol. B 23(1), Jan./Feb. 2005.

McIntyre and Neureuther, "*Phase-shifting Mask Polarimetry: Monitoring Polarization at 193-nm High Numerical Aperature and Immersion Lithography with Pahse Shifting Masks*," J. Mictolith., Microfab., Microsyst., 4(3), 031102 (Jul.- Sep. 2005).

U.S. Appl. No. 11/053,725, filed Feb. 7, 2005.

* cited by examiner

*Primary Examiner*—Tu T. Nguyen
(74) *Attorney, Agent, or Firm*—John P. O'Banion; Henry K. Woodward

(57) ABSTRACT

A method to monitor the state of polarization incident on a photomask in projection printing is presented. The method includes a series of phase-shifting mask patterns that take advantage of high NA effects to create a signal dependent on only one incident polarization component. The patterns include in two embodiments a Radial Phase Grating (RPG) and Proximity Effect Polarization Analyzers (PEPA). A test reticle design includes multiple polarimeters with an array of pinholes on the backside of the photomask. This technique is able to monitor any arbitrary illumination scheme for a particular tool.

9 Claims, 6 Drawing Sheets

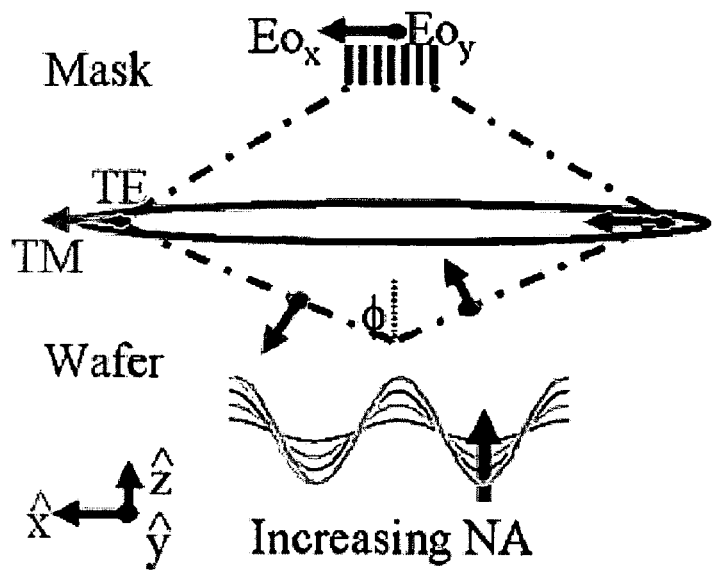
Fig. 1
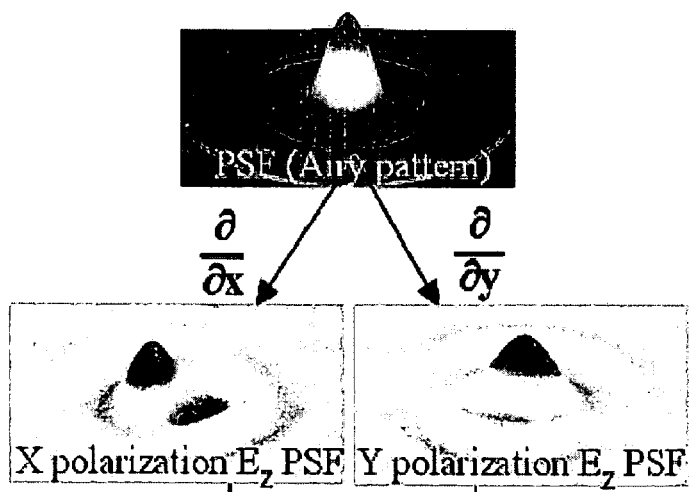
Fig. 2a
Fig. 2b
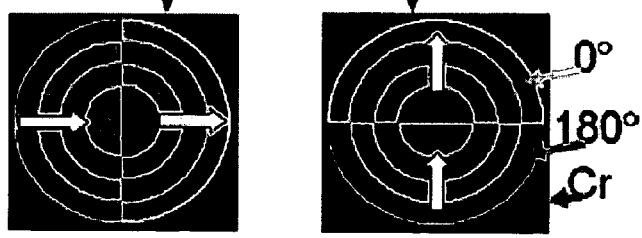
Fig. 2c

PHASE-SHIFTING TEST MASK PATTERNS FOR CHARACTERIZING ILLUMINATION POLARIZATION BALANCE IN IMAGE FORMING OPTICAL SYSTEMS

CROSS REFERENCE TO RELATED APPLICATIONS [0001]

This application claims priority from U.S. Provisional Application 60/654,346, filed Feb. 18, 2005, which is incorporated herein by reference for all purposes.

BACKGROUND OF THE INVENTION

This invention relates generally to image forming optical systems, and more particularly the invention relates to phase shifting test mask patterns for characterizing illumination and mask quality in such systems.

A phase shifting mask alters the phase of light passing through certain areas of a photo mask in order to utilize destructive interference to improve resolution and depth of focus in optical lithography. The semiconductor industry is now considering such masks for use in fabricating integrated circuits such as mega bit memory and microprocessors which contain millions of transistors.

The phase shifting mask and its use in an image forming optical system must be free of printable defects. To this end, a mask with phase shifted regions can act as a precision instrument for characterizing the imaging.

Copending application Ser. No. 11/053,725, filed Feb. 7, 2005 discloses three new classes of phase-shifting mask patterns. In optical image forming systems, a mask with phase shifted regions can act as a precision instrument for characterizing imaging. Three new classes of phase-shifting mask patterns have been invented to characterize projection printing tool illumination and phase-shifting mask (PSM) performance. The linear phase grating (LPG) and linear phase ring (LPR) both serve to characterize illumination angular distribution and uniformity. A third new class, the interferometric-probe monitor for phase-shifting masks (IPM-PSM), measures the effective phase, transmittance and edge effects of various phase-shifted mask features. All three patterns allow performance comparison across the field, tool-to-tool, over time, or to intended design.

The present invention is directed to a new class of phase shifting test mask to characterize both linear and circular polarization balance of the illumination incident upon the object in high numerical aperature (NA) and immersion projection printing system. The patterns are referred to as Phase Shift Mask Polarization Analyzers and exist in two embodiments: a radial phase grating (RPG) and a more sensitive Proximity Effect Polarization Analyzer (PEPA).

SUMMARY OF THE INVENTION

In accordance with the invention, a method to monitor the state of polarization incident on the photomask in projection printing is presented. The method includes a series of phase-shifting mask patterns that take advantage of high NA effects to create a signal dependent on only one incident polarization component. They are derived from basic principles and are theoretically the most sensitive patterns to polarization. A polarimeter is then constructed of six of these patterns that, when properly calibrated, is sufficient to measure the Stokes parameters of the incident illumination. A test reticle design is proposed, consisting of multiple polarimeters with an array of pinholes on the backside of the photomask. This technique is able to monitor any arbitrary illumination scheme for a particular tool. Calibration of the test mask is required. However, proper calibration is likely to enable accurate full pupil polarization characterization, even when severe mask topography effects and reasonable maskmaking limitations are considered.

In specific embodiments, a set of test mask patterns are constructed of alternating phase, radial arrays to scatter light into high angle spatial frequencies, creating a central intensity dependent only on the local state of polarization. Two embodiments of the patterns are employed. One is derived from the proximity effects of high numerical aperture imaging and is termed the Proximity Effect Polarization Analyzer. The other is a periodic alternating phase radial grating and is referred to as the Radial Phase Grating (RPG). For either pattern, two two-phase patterns measure the orthogonal linear polarization components for on-axis illumination while an additional two four-phase patterns determine the phase relationship between those components. Both linear and circular polarization balance can also be measured from off-axis illumination by implementing a four-phase linear progression into the rings of the radial pattern. The measurement simply involves determining the intensity of light at the center of the pattern in the image plane. This can be accomplished with any image detector with sufficient resolution, for example photoresist used in optical lithography or a charged coupled device.

The phase shifting mask (PSM) polarization analyzers create a signal sensitive to only one polarization component by leveraging the residual effect of the electric field normal to the image plane in high-NA imaging. As high spatial frequency light interferes on the image plane, the steep angle of incidence introduces an electric field oriented normal to image plane. The polarization component responsible for creating this normal component is the one oriented radially in the pupil (often referred to as the transverse magnetic (TM) component). The analyzer takes advantage of this effect by engineering which polarization component incident on the object plane (x- or y-polarization) is responsible for creating the TM component in the pupil. Thus, the orientation of the analyzer on the mask determines which polarization component is responsible for the signal on the image plane. Two perpendicular analyzers allow comparison between orthogonal polarization components. The electric field normal to the image plane is typically unaccounted for in scalar imaging theory and can become appreciable at high-NA.

A similar effect can be seen by monitoring the nulls in the image plane due to an alternating phase, linear grating on the object plane. At high-NA, the nulls of the 2-beam interference pattern rise due to the normal electric field component caused by the TM polarization in the pupil. The intensity at the center of the PSM polarization analyzer is based on this same principle. However, the proximity effect analyzers and radial grating helps to focus more of this high-NA effect into the center of the pattern, allowing for increased signal over a simple linear grating by greater than a factor of two.

The invention and object and features thereof will be more readily apparent from the following detailed description and appended claims when taken with the drawings.

BRIEF DESCRIPTION OF THE DRAWINGS

FIG. 1 illustrates High NA imaging which produces a z component of electric field at the image plane from TM polarized light in the pupil plane.

FIGS. 2(a)–2(c) illustrate the spatial derivative of the Proximity Effect Polarization Analyzer (PEPA) including the (a) low NA PSF results in (b) two polarization-dependent z-component point spread functions (PSFs), and in (c) the corresponding mask patterns are, due to reciprocity, the most sensitive to one polarization.

DETAILED DESCRIPTION OF ILLUSTRATIVE EMBODIMENTS

Figure 3A:
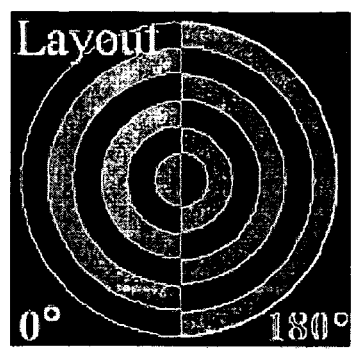
FIGS. 3(a)–3(c) illustrate (a) design, (b) mask image, and (c) resist profile dose show evidence of the desired high NA signal of a Radial Phase Grating (RPG) polarization analyzer.

As noted above, high numerical aperture (NA) lens systems allow for large angle spatial frequencies which, in turn, produce smaller features on the wafer. However, a generally unwanted side effect of high NA imaging is the introduction of an electric field component oriented in the z direction, or normal to the wafer plane. This z component of the electric field is dependent only on the polarization component oriented radially in the pupil, often referred to as the transverse magnetic (TM) component. As shown in FIG. 1, this z component originates from the oblique angle of incidence and, since intensity is the square of the electric field, becomes appreciable at high NA. Thus, in the realm of high NA imaging, traditional scalar diffraction theory begins to breakdown and the true vector nature of light must be considered.

The PSM polarimeters in accordance with the invention create a measurable z-component signal by engineering which polarization component becomes subject to high NA effects. A set of six patterns (or in polarimetry terminology, six analyzers) allows for direct measurement of the Stokes parameters. This forms a complete characterization of the polarization state of incident illumination.

The z component of the electric field at the image plane due to high NA effects can be shown to follow the relation:

$$E_z(x) = \sin(\phi)E_{TM}(x) = \frac{NA}{n_{resist}}E_{TM}(x) = \frac{k_x}{k_0}E_{TM}(x) = \frac{j}{k_0}\frac{\partial}{\partial x}E_{TM}(x)$$

where $k_x$ is the propagation vector along the wafer. Thus, the z-component of the electric field is proportional to the spatial derivative of the low-NA, or scalar, x-component. For example, the z-component of a 2-beam interference pattern will behave sinusoidally, image reversed and out of phase with the traditional low-NA cosine image.

Considering three dimensions, the point spread function that describes proximity effects can be differentiated in the x- and y-directions to form two polarization-dependent, $E_z$ point spread functions (PSFs). These PSFs are shown in FIG. 2(b) and illustrate the polarization-dependent proximity effect for the, typically unwanted, z-component of light. Thus, for coherent illumination (single source point), the z-component image intensity can be computed via summing up the convolutions of these PSFs with the reticle layout, where the two convolutions are weighted by the degree of polarization. Identically, for any image location, the z-component contribution from one polarization component is simply the sum of the layout multiplied by the proximity function centered on that location. This concept, known as reciprocity, then implies that an object pattern resembling the $E_z$ PSF, as shown in FIG. 2c, will have the maximum coherent 'spill-over' of z-component light into the center of the image. In other words, this pattern becomes a detector for one polarization component where the measured signal is the intensity at the center of the pattern's image. This embodiment is the most sensitive analyzer and is termed the Proximity Effect Polarization Analyzer (PEPA). Two patterns oriented perpendicular to each other become a means of comparing the amount of light in orthogonal polarization components. The arrows in FIG. 2(c) depict the polarization components for each pattern that result in the TM component in the pupil, and thus the z-component signal on the wafer. The dimension for the inner ring radius is $$r_{inner} = \frac{0.85\,M\lambda}{NA},$$

each outer ring's width is:

$$width_{outer} = \frac{0.5\,M\lambda}{NA}.$$

An effect similar to that used by the PSM polarimeters can be seen by monitoring the nulls in the image plane due to an alternating phase, linear grating on the object plane, as was shown in FIG. 1. At high-NA, the nulls of the 2-beam interference pattern rise due to the normal electric field component caused by the TM polarization in the pupil. Alternately, a periodic grating in the radial direction, the Radial Phase Grating (RPG) as shown in FIG. 3a, provides greater signal strength by focusing more of this high-NA effect into the center of the pattern[4].

Figure 3B:
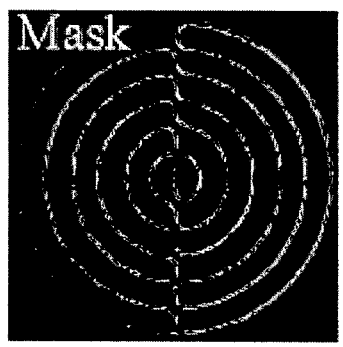
Figure 3C:
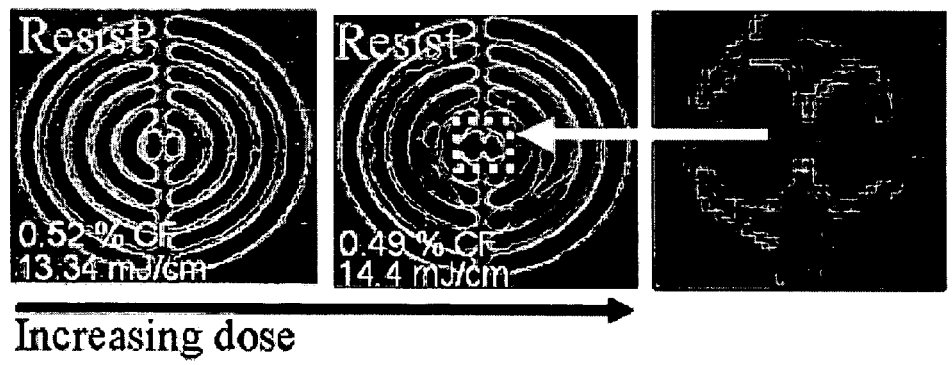

An initial experiment, conducted using a phase shift test mask donated to University of California Berkley by Photronics (Allen, Tex.), was done to test this concept using a periodic radial grating (RPG). An example design layout of the periodic radial grating, scanning electron microscope (SEM) image of the mask, and SEM image of the resulting resist pattern are shown in FIG. 3. The resist remaining in the center of FIG. 3(*c*), whereas all of the other phase boundaries have cleared, is believed to be evidence of the desired high-NA effect. Biasing of the 180 regions is recommended to decrease the transmission imbalance between the phase regions, which is evident from the resist image. Additionally, the monitors perform best with very coherent illumination, a point that will be discussed in paragraph [0046] et sec. where a backside pinhole is suggested on the test reticle to achieve an effective sigma (σ) of 0.1. Experiments with the radial grating showed only minimal high-NA effects, since the smallest achievable illuminator with the 0.85 NA tool available was 0.34. Monitoring of polarization for off-axis illumination is also possible, and will be discussed in hereinbelow.

Figure 4:
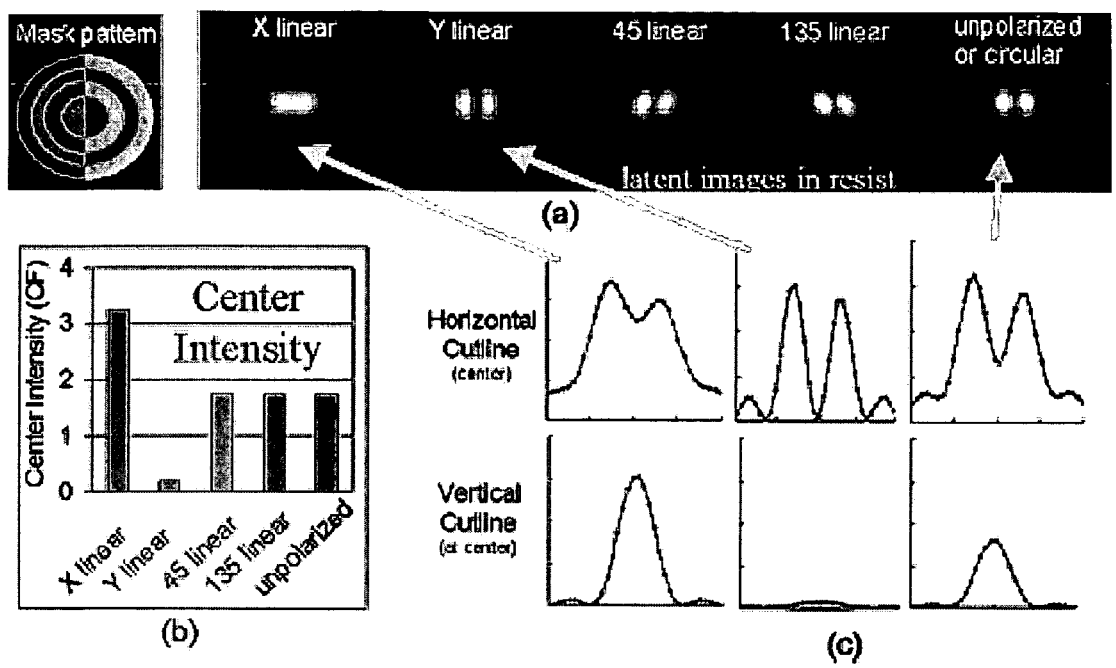
FIGS. 4(a)–4(c) illustrate (a) simulated latent resist images for one analyzer under various illumination conditions which show (b) good sensitivity to polarization. and in (c) the measurement consists of determining the intensity at the center of the image, which is shown to be a saddle. (Resist stack: resist: n=1.7, k=0.018, 225 nm; ARC: n=1.5, k=0.54, 35 nm.)

The PSM polarimeters derived from the point spread function produce a signal greater than a simple linear grating by greater than a factor of three—or than a periodic radial grating by a factor of 1.5. FIG. 4 shows a progression of aerial images of an on-axis analyzer designed to detect light in the x-polarization. Simulations were conducted in TEMPEST Panoramic[5], accounting for the full vector nature of light and mask topography effects. Note that the 180 degree phase etch of this chromeless pattern was optimized to be about 195 degrees for this example[6]. The five images show how the aerial image changes as the pattern is illuminated with a normally incident cone of light (sigma=0.1) with the following polarization states: linear-x polarized, linear-y polarized, linear 45-polarized, linear-135 polarized, and unpolarized. The corresponding plot tracks the central intensity for each simulated image, showing good sensitivity to polarization state. Additionally, the aerial image cutlines in FIG. 4(*c*) depict how the center of the image generally forms a saddle, with peaks in the direction of the polarization being measured and nulls in the opposite direction.

In calculating the Stokes parameters, a set of six calibrated PSM analyzers is theoretically sufficient to completely characterize the state of incident polarization in high-NA projection printing systems. The theory described hereafter is familiar to the field of polarimetry. In polarimetery, asset of analyzers are used to each measure the flux (F) of one polarization component in the incident light. To account for the fact that the analyzers will not consist of perfect polarization elements, the analyzers are first calibrated, producing a polarimetric measurement matrix (W) for each set of six analyzers. This calibration data is then used to determine the measured Stokes parameters ($S_m$) describing the polarization state from any arbitrary illumination by solving a set of linear equations. Calibration is accomplished via simulation; however practical implementation would likely require experimental characterization of the PSM test reticle. It is noted that accurate calibration will alleviate imperfections introduced by mask topography effects such as vector effects and mask making limitations. Thus, reasonable mask making errors such as layer-to-layer misalignment and phase etch inaccuracies will be tolerated.

In the Mueller calculus, commonly used in polarimetry, the Stokes vector (S) is used to describe the polarization state of light. This vector is defined relative to six flux measurements (P) performed on the light with ideal polarizers placed in front of a detector. The Stokes vector is defined as:

$$S = \begin{bmatrix} s0 \\ s1 \\ s2 \\ s3 \end{bmatrix} = \begin{bmatrix} P_{TE} + P_{TM} \\ P_{TE} - P_{TM} \\ P_{45} - P_{135} \\ P_R - P_L \end{bmatrix},$$

where $P_{TE}$, $P_{TM}$, $P_{45}$, $P_{135}$, refer to the measured flux from an ideal linear polarizer oriented at 0, 90, 45, and 135 degrees and $P_R$, $P_L$ refer to that from ideal right and left circular polarizers. In other words, this is the true flux of light in each polarization component. Note that the coordinate system of TE/TM is used here (as opposed to H/V or X/Y) to account for incident angles resulting from the use of circular apertures in projection printing, an important distinction for the off-axis analyzers introduced in the next section. The 0 degree axis is defined here in the direction of the TE component (or for the on-axis case, in the y-direction).

Figure 5:
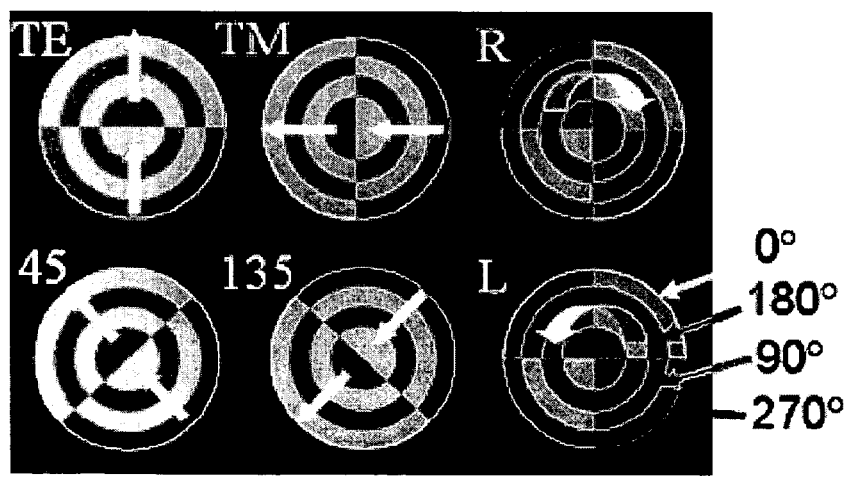
FIG. 5 illustrates a polarimeter comprised of six analyzers and, when properly calibrated, is sufficient to determine the Stokes parameters (shown here for on-axis illumination).

FIG. 5 shows the proposed set of six analyzers that form the PSM polarimeter. The four patterns on the left create a signal dependent on a particular linear polarization component, where as the two on the right monitor right and left circular polarization, respectively. The circular polarization patterns introduce a 90 and 270 degree portion of the analyzer, and are described in J. Vac. Sci. Techhnol. B 23, 302–306 (2005). The four phase regions form a vortex in the center where plane wave illumination is circularly rotated in a corkscrew-like manner, creating a central intensity dependant on the degree of circular polarization. The only difference between the two patterns is the direction of rotation, either right- or left-hand circular.

To calibrate the imperfect analyzers, each is first characterized by an analyzing vector (A), containing four components defined in a manner analogous to a Stokes vector. Defining $F_{TE,TM}$ to be the actual flux measurement taken by the TE analyzer when one unit of TM polarized light is incident, the analyzing vector (A) of a single analyzer is defined as:

$$A_{TE} = \begin{bmatrix} a_{0,TE} \\ a_{1,TE} \\ a_{2,TE} \\ a_{3,TE} \end{bmatrix} = \begin{bmatrix} F_{TE/TE} + F_{TE/TM} \\ F_{TE/TE} - F_{TE/TM} \\ F_{TE/45} - F_{TE/135} \\ F_{TE/R} - F_{TE/L} \end{bmatrix},$$

$$A_{TM} = \begin{bmatrix} a_{0,TM} \\ a_{1,TM} \\ a_{2,TM} \\ a_{3,TM} \end{bmatrix} = \begin{bmatrix} F_{TM/TE} + F_{TM/TM} \\ F_{TM/TE} - F_{TM/TM} \\ F_{TM/45} - F_{TM/135} \\ F_{TM/R} - F_{TM/L} \end{bmatrix},$$

where the response ($F_{TE,arb}$) of the single TE analyzer to an arbitrary polarization state ($S_{arb}$) is:

$$F_{TE,arb} = A_{TE} \cdot S_{arb} = a_{0,TE}s_{0,arb} + a_{1,TE}s_{1,arb} + a_{2,TE}s_{2,arb} + a_{3,TE}s_{3,arb}.$$

The analyzing vectors of the six PSM analyzers are grouped together in the polarimetric measurement matrix (W), defined as follows:

$$W = \begin{bmatrix} A_{TE}^T \\ A_{TM}^T \\ A_{45}^T \\ A_{135}^T \\ A_R^T \\ A_L^T \end{bmatrix} = \begin{bmatrix} a_{0,TE} & a_{1,TE} & a_{2,TE} & a_{3,TE} \\ a_{0,TM} & a_{1,TM} & a_{2,TM} & a_{3,TM} \\ a_{0,45} & a_{1,45} & a_{2,45} & a_{3,45} \\ a_{0,135} & a_{1,135} & a_{2,135} & a_{3,135} \\ a_{0,R} & a_{1,R} & a_{2,R} & a_{3,R} \\ a_{0,L} & a_{0,L} & a_{0,L} & a_{0,L} \end{bmatrix}$$

Once the polarimeter (generally consisting of six PSM analyzers) is calibrated by W, the Stokes vector of any arbitrary illumination is theoretically related to the six measured flux values from the set of analyzers (F) by:

$$F = \begin{bmatrix} F_{TE} \\ F_{TM} \\ F_{45} \\ F_{135} \\ F_R \\ F_L \end{bmatrix} = WS_{arb}$$

or, likewise:

$$F = \begin{bmatrix} D_{CF}/D_{TE} \\ D_{CF}/D_{TM} \\ D_{CF}/D_{45} \\ D_{CF}/D_{135} \\ D_{CF}/D_R \\ D_{CF}/D_L \end{bmatrix} = WS_{arb}$$

where $D_{CF}/D_{TE}$ refers to the dose that causes the resist in the center of the TE analyzer image to clear, relative to the clear field.

Finally, to determine the Stokes vector of the actual illumination:

$$S_m = W^{-1} F$$

where $S_m$ refers to the measured Stokes vector to account for errors between the calibrated and actual W. Without errors, $S_m$ would be equal to the actual $S_{arb}$. More than four analyzers have been used to minimize the impact of noise, where four is the minimum needed to form a complete polarimetry measurement. However, since more than four analyzers are used, W is not a square matrix, thus $W^{-1}$ is not unique, and $S_m$ is over determined by the measurements. A least squares estimate for $S_m$ determines the optimum $W^{-1}$ to be the psuedoinverse ($W_p^{-1}$) of W as $W_p^{-1} = (W^T W)^{-1} W^T$. Thus, the best estimate of $S_m$ is:

$$S_m = (W^T W)^{-1} W^T F$$

The theory previously described can be applied to two practical examples via simulation studies. First, an example of monitoring polarization from an on-axis cone of light is shown using the set of analyzers introduced in FIG. 5. Next, the analyzers are modified to detect polarization from an off-axis cone of light by introducing a four phase, linear phase progression into the patterns. All simulations have been performed with TEMPEST Panoramic, accounting for the true vector nature of light, with the following parameters: wavelength ($\lambda$) of 193 nm, NA of 0.93, magnification (M) of 4, and monopole illumination with $\sigma$=0.1. The resist stack consisted of 225 nm resist (n=1.7, k=0.018) and 35 nm of antireflective coating (n=1.5, k=0.54). This resist stack was chosen due to its availability, however it is noted that increased sensitivity can be achieved by tuning the resist parameters.

Simulated Example 1: On-Axis Polarimeter—First, the set of six analyzers shown in FIG. 5 are simulated with on-axis illumination under seven ideal illumination conditions: TE(0°) linear, TM(90°) linear, 45° linear, 135° linear, right circular, left circular, and unpolarized light. The resulting measured flux values (intensity at the center of the image relative to the clear field) are listed in Table 1.

TABLE 1

Simulation measurements for calibration of on-axis polarimeter (in units of clear field intensity).

| | | Incident polarization state | | | | | | |
|---|---|---|---|---|---|---|---|---|
| | | Linear | | | | Circular | | Un- |
| | | TE | TM | 45 | 135 | R | L | polarized |
| Analyzer | TE | 3.27 | 0.19 | 1.73 | 1.73 | 1.73 | 1.73 | 1.73 |
| | TM | 0.19 | 3.27 | 1.73 | 1.73 | 1.73 | 1.73 | 1.73 |
| | 45 | 1.73 | 1.73 | 3.27 | 0.19 | 1.73 | 1.73 | 1.73 |
| | 135 | 1.73 | 1.73 | 0.19 | 3.27 | 1.73 | 1.73 | 1.73 |
| | R | 1.37 | 1.76 | 1.43 | 1.71 | 2.99 | 0.15 | 1.57 |
| | L | 1.76 | 1.37 | 1.43 | 1.71 | 0.15 | 2.99 | 1.57 |

Note that the linear polarization analyzers are slightly more efficient at creating a polarization-dependent signal than the circular analyzers. This is because the 90 and 270 regions in the circular analyzers introduce additional mask topography effects and a net decrease in coherent addition of z-component light at the center of the pattern. Although all analyzers do not behave as perfect polarizers, calibration of the polarimetric measurement matrix (W) enables the set of six patterns to accurately characterize an actual illumination scheme. The resulting W matrix is listed in Table 2.

TABLE 2

Calculated W matrix for on-axis polarimeter.

| | | Analyzer vectors (A) | | | |
|---|---|---|---|---|---|
| | | a0 | a1 | a2 | a3 |
| Analyzer | TE | 3.46 | 3.08 | 0 | 0 |
| | TM | 3.46 | −3.08 | 0 | 0 |
| | 45 | 3.46 | 0 | 3.08 | 0 |
| | 135 | 3.46 | 0 | −3.08 | 0 |
| | R | 3.13 | −0.39 | −0.28 | 2.84 |
| | L | 3.13 | 0.39 | −0.28 | −2.84 |

To simulate an example that may be of practical interest, the response of the on-axis polarimeter to two illumination conditions is considered. First, if the illuminator design is intended to produce light that is 80% TE (y) polarized (where the remaining 20% is unpolarized), then the intended Stokes parameters and expected measured flux values are:

$$S_{intended} = \begin{bmatrix} 1 \\ 0.8 \\ 0 \\ 0 \end{bmatrix},$$

$$F_{predicted} = \begin{bmatrix} 2.96 \\ 0.50 \\ 1.73 \\ 1.73 \\ 1.41 \\ 1.73 \end{bmatrix} (CFIntenstiy)$$

However, suppose the actual measurements produce the flux values below (a simulated example using 70% TE(y) polarized light). Calculations with the calibrated W matrix show the measured illumination condition to be 69.8% TE (y) polarized. The resulting error is only about 0.2%.

$$F_{actual(simulated)} = \begin{bmatrix} 2.81 \\ 0.66 \\ 1.73 \\ 1.73 \\ 1.43 \\ 1.71 \end{bmatrix} (CFIntenstiy),$$

$$S_{m,actual(calculated)} = W^{-1}F = \begin{bmatrix} 1 \\ 0.698 \\ 0.000 \\ -0.001 \end{bmatrix}$$

Figure 6:
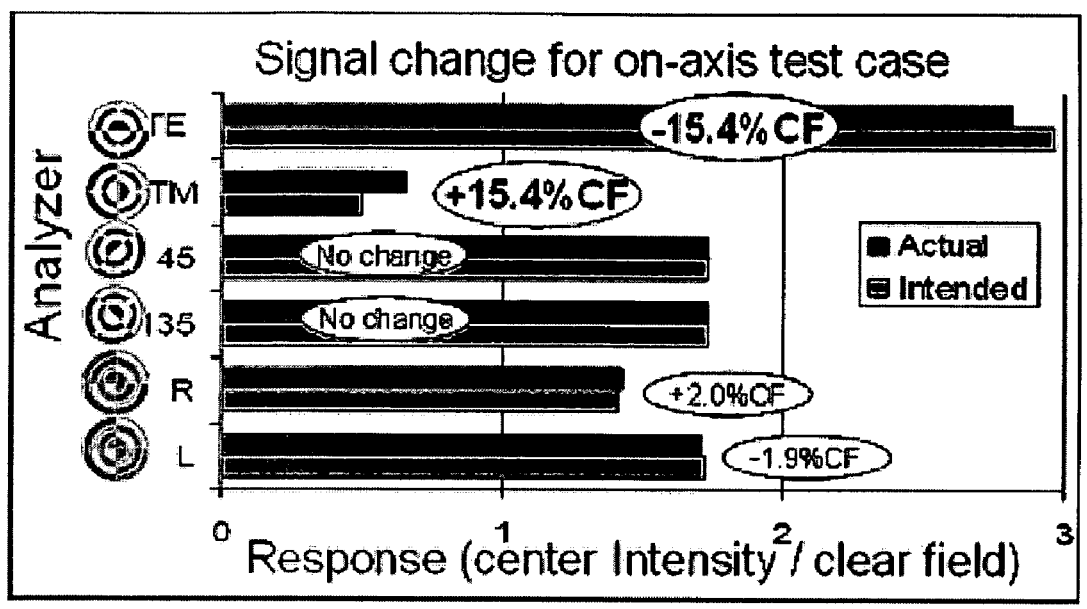
FIG. 6 illustrates perturbation of the response of six analyzers for two simulated on-axis illumination conditions: intended (80% TE polarized, 20% unpolarized), and actual (70% TE polarized, 30% unpolarized).

The two conditions are compared in FIG. 6, showing that the signal provided by both the TE and TM analyzers change by about 15% of the resist clear field for this 10% variation in polarization (i.e. 2.96–2.81 and 0.50–0.66). Thus, if calibrated accurately, this 4-ring on-axis polarimeter is likely to measure polarization with a sensitivity of roughly 1.5 percent of the clear field per percent change in polarization. The authors have, in previous experiments, been able to measure variations of about one percent of the clear field in resist. Simulation capabilities restricted this analysis to the 4-ring analyzers shown in FIG. 5. However, depending on the coherence of the illumination, more rings can provide greater signal.

Simulated Example 2: Off-Axis Polarimeter—The second example considered in this section is of a set of analyzers designed to monitor polarization from off-axis illumination. This example shows the necessity of pre-calibrating the analyzers and, although the mask topography effects are much more severe than the on-axis analyzers, shows the measurement to be as accurate.

Figure 7:
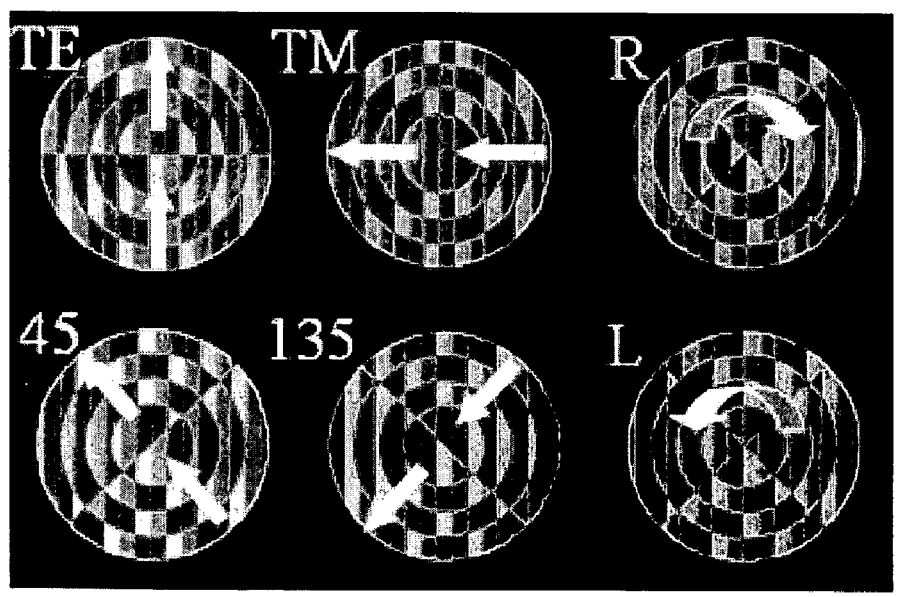
FIG. 7 illustrates a polarimeter designed for off-axis illumination with a four-phase linear phase progression is incorporated into the pattern to redirect the diffraction pattern into the pupil.

To monitor off-axis illumination, the monitors shown in FIG. 5 are modified by multiplying them by a four-phase linear phase progression (0°, 90°, 180°, 270°), as shown in FIG. 7. The four-phase grating, described further in [8], serves to diffract the incident plane wave into only the +1 and higher orders. In other words, it redirects the light into the pupil at an angle determined by the period of the four-phase grating. Consequently, the period is chosen to correspond to the desired off-axis measurement location ($\sigma_c$) by:

$$P = \frac{M * \lambda}{\sigma_C * NA}.$$

Thus, the off-axis analyzers combine two effects to monitor polarization: redirection by the four phase grating and high-NA diffraction by the radial pattern to produce the polarization dependent z-component signal at the wafer. Again, the arrows in FIG. 7 indicate which polarization component is being measured. To counteract mask topography effects, the actual etch depths for the phase shifted regions were roughly optimized to be 95°, 195°, and 300° for this example.

A practical example similar to that used for the on-axis monitor was simulated. The only difference being the modifications to the patterns and that the monopole center was moved to $\sigma_c = 0.81$. The resulting flux measurements and calculated W matrix are listed in Table 3 and Table 4, respectively.

TABLE 3

Simulation measurements for calibration of off-axis ($\sigma_c$ = 0.81) polarimeter (clear field intensity).

| | | Incident polarization state | | | | | |
| --- | --- | --- | --- | --- | --- | --- | --- |
| | | Linear | | | | Circular | Un- |
| | | TE | TM | 45 | 135 | R | L | polarized |
| Analyzer | TE | 1.42 | 0.11 | 0.92 | 0.58 | 0.58 | 0.92 | 0.75 |
| | TM | 0.06 | 1.83 | 0.96 | 0.96 | 0.96 | 0.96 | 0.96 |
| | 45 | 0.79 | 1.10 | 1.80 | 0.10 | 0.85 | 1.04 | 0.95 |
| | 135 | 0.87 | 0.62 | 0.07 | 1.41 | 0.65 | 0.83 | 0.74 |
| | R | 0.77 | 1.02 | 0.98 | 0.82 | 1.70 | 0.10 | 0.90 |
| | L | 0.79 | 0.61 | 0.75 | 0.65 | 0.15 | 1.25 | 0.70 |

TABLE 4

Calculated W matrix for off-axis polarimeter.

| | | Analyzer vectors (A) | | | |
| --- | --- | --- | --- | --- | --- |
| | | a0 | a1 | a2 | a3 |
| Analyzer | TE | 1.53 | 1.31 | 0.34 | −0.3 |
| | TM | 1.89 | −1.8 | 0 | 0 |
| | 45 | 1.89 | −0.3 | 1.7 | −0.2 |
| | 135 | 1.49 | 0.25 | −1.3 | −0.2 |
| | R | 1.79 | −0.25 | 0.16 | 1.60 |
| | L | 1.40 | 0.18 | 0.10 | −1.10 |

Considering again the practical example where the illuminator design is intended to produce dipoles with 80% TE polarized light (20% unpolarized), the expected Stokes parameters and measured flux values would be:

$$S_{intended} = \begin{bmatrix} 1 \\ 0.8 \\ 0 \\ 0 \end{bmatrix},$$

-continued $$F_{predicted} = \begin{bmatrix} 1.28 \\ 0.24 \\ 0.82 \\ 0.84 \\ 0.79 \\ 0.77 \end{bmatrix} (CFIntenstiy)$$

However, if the actual illumination was only 70% TE polarized light, then the measured flux values are simulated to be as shown below. Calculations using the derived set of linear equations and the calibrated W matrix imply the actual light is 69.2% TE polarized, an error of less than 1%.

$$F_{actual(simulated)} = \begin{bmatrix} 1.22 \\ 0.33 \\ 0.84 \\ 0.83 \\ 0.81 \\ 0.76 \end{bmatrix} (CFIntenstiy)$$

$$S_{m,actual(calculated)} = W^{-1}F = \begin{bmatrix} 1 \\ 0.692 \\ 0.001 \\ -0.001 \end{bmatrix}$$

Figure 8:
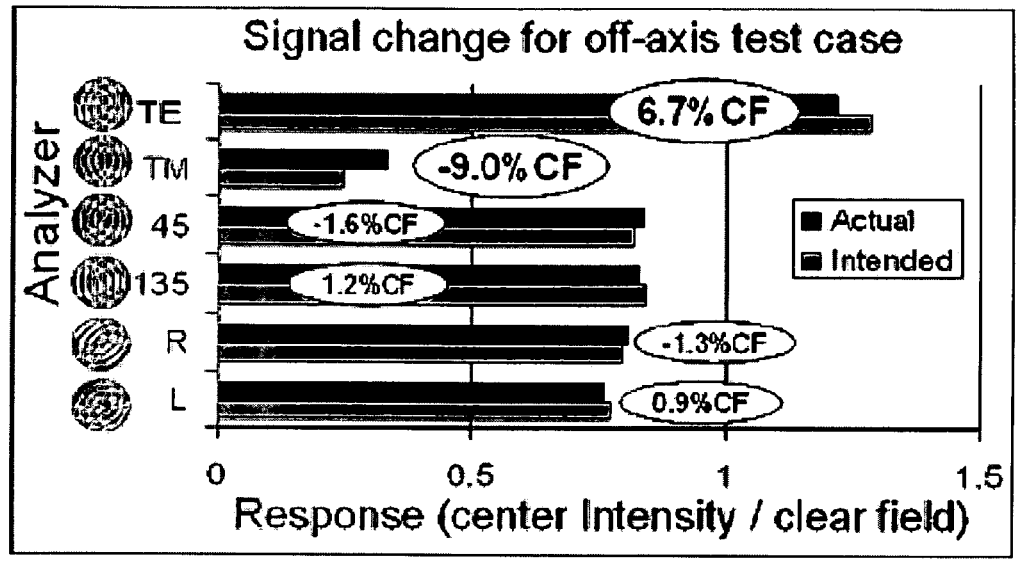
FIG. 8 illustrates perturbation of the response of six analyzers for two simulated off-axis (σC=0.81) illumination conditions: intended (80% TE polarized, 20% unpolarized), and actual (70% TE polarized, 30% unpolarized).

A comparison of the two conditions, shown in FIG. 8, predicts the TE and TM analyzers will change by +6.7 and −9.0 percent of the clear field, respectively. Thus, these 4-ring off-axis monitors are likely to measure polarization with a sensitivity of roughly 0.75 percent of the clear field per percent change in polarization. Again, although the different patterns behave differently, calibration of the W matrix allows for reasonable characterization of the actual illumination.

Figure 9:
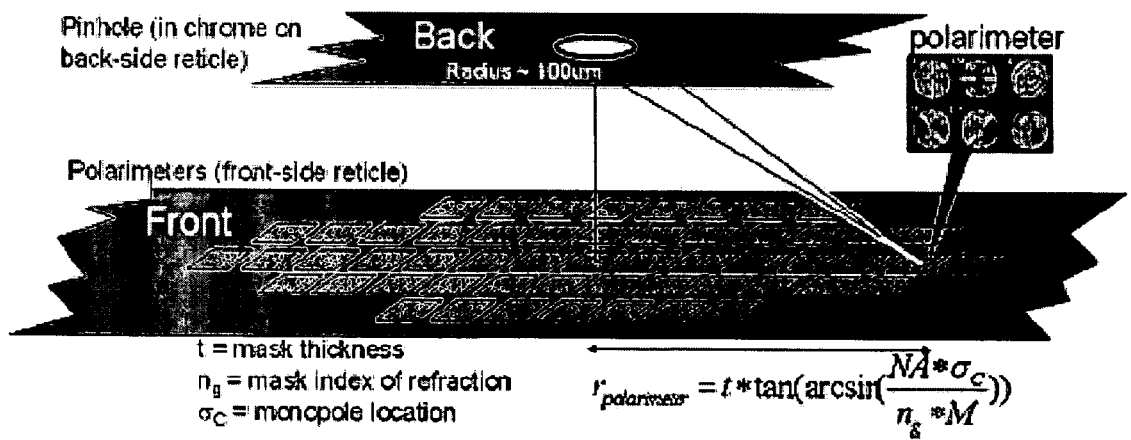
FIG. 9 illustrates a test reticle in accordance with one embodiment of the invention in which each field location contains a cluster of polarimeters in the vicinity of a pinhole on the backside of the mask for explained reasons.

Consider now a proposed test reticle. The PSM polarimeters require very coherent light for maximum sensitivity. Thus, they will work best when combined with an aperture to allow only a small cone of incident light (i.e. a small monopole). This can be achieved with a pinhole on the backside of the mask (or some other type of aperture). Without the aperture, this technique is likely to only measure polarization for very small sigma (conventional), or perhaps small dipoles. Using pinholes on the back of the reticle will enable polarization characterization of the full illuminator. A proposed reticle design is depicted in FIG. 9, showing the front and backside of the reticle for a particular field location. Multiple polarimeters are used in a cluster near each pinhole location, where each polarimeter has a unique period and orientation of the four-phase linear progression depending on its relative location to the pinhole, or likewise, the desired $\sigma_c$ measurement. This configuration may be repeated across the test reticle, allowing comparison across the field.

To account for mask topography effects, calibration of each polarimeter is required resulting in a unique W matrix for each set of analyzers. Although proper simulation can determine the theoretical W matrices, experimental determination of the W matrices is suggested to account for realistic mask making limitations. Future work may involve developing this experimental calibration, but a possible means of calibration would be with a simple apparatus containing a laser, linear polarizers, a quarter wave plate (for circular polarization), and detectors (or one dome-shaped detector). Each analyzer would be illuminated with a series of properly polarized beams and the amount of light scattered into the appropriate high-NA angles would be recorded. Six readings for each of the six analyzers gives the experimental flux measurement values needed to calculate W. It is noted that the accuracy of the measurement will largely depend on the ability to calibrate W. The reticle would then be exposed at best focus through increasing exposure dose with the desired illumination scheme. For each analyzer, the dose that causes the resist to just clear is recorded as the signal.

Consider now potential limiting effects. Various effects due to practical imaging conditions are likely to impact the effectiveness of this monitoring technique. Some of these effects, such as those caused by mask topography, resist, illuminator and projection lens systems are briefly discussed in this section.

Figure 10:
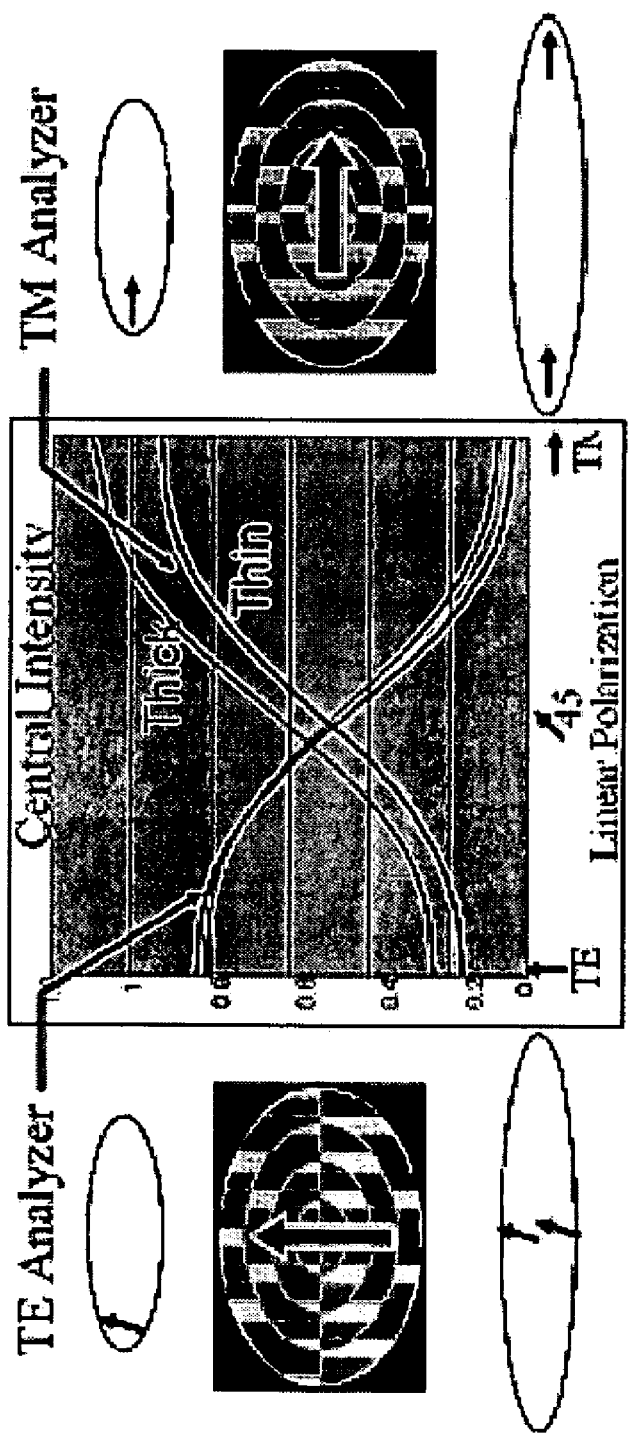
FIG. 10 illustrates TE and TM off-axis analyzers (periodic radial grating) with different response to incident polarization.

Multiple phase etches, combined with small features, indicate mask topography effects are likely to be severe. These effects can arise from either mask making limitations or, even in the case of a perfectly constructed reticle, from electromagnetic interaction with the steep mask topography. To understand the impact of vector electromagnetic effects, the response of the periodic radial TE and TM analyzers under off-axis illumination are compared in FIG. 10. Two observations are evident from this plot. First, the thin mask simulation does not match the thick mask simulation for only the TM analyzer. This is likely due to the manner in which the relevant polarization component (TM-component) interacts with the four-phase linear progression within the rings. When this component is perpendicular to the four-phase progression (i.e. locally the TM component), then the electromagnetic interaction with the mask topography as it propagates through the mask prevents clean redirection of the diffracted orders. However, when this component is parallel to the four-phase progression (i.e. locally the TE component), as with the TE analyzer, then that component is cleanly redirected. This effect on the local TM component will be worse with higher angles of incidence.

The second observation is that the two thin mask simulations do not exactly mirror each other, as would be expected. This can be contributed to the fact that there are two effects happening simultaneously. First, the light is being redirected by the four-phase progression (i.e. diffracted into only the +1 and higher orders). Second, the light is being diffracted by the radial grating with two orders captured by the pupil. When these two effects are in orthogonal planes, as they are with the TE analyzer, then a clean separation of the effects results. However, when these two effects are in the same plane, as with the TM analyzer, they tend to get blended together. This results in an unwanted DC order passing through the center of the projection lens. Thus, the entire curve for the TM analyzer is raised by this DC component.

Realistic mask making limitations are likely to add to the discrepancy between behaviors of the patterns. However, proper calibration of each polarimeter should ensure the functionality of this technique and appears feasible with state of the art photomask technology and reasonable layer alignment and phase etch accuracy. Additionally, pinhole alignment on the backside of the reticle is somewhat difficult and is of concern. Sensitivity to pinhole alignment is greater at higher angles of incidence (larger $\sigma_c$) due to the corresponding greater change in phase across the mask pattern. However, initial simulation studies show that a pinhole misalignment of about 100 μm ($\sigma_c$ variation of 0.1 at $\sigma_c$=0.81) only decreases signal strength by roughly 15%. Again, reticle calibration should account for the changed response of each analyzer.

Resist effects serve to decrease the high-NA signal and increase experimental error. However, use of a low index resist, such as perhaps PMMA ($n_r$~1.3), will help alleviate this effect although very high exposure doses may be required. In some cases, choice of resist can make the measurement easier by converting an image saddle into a peak. Also, to avoid tedious resist measurements, an automated technique should be implemented, perhaps with a CD-SEM.

This technique is completely extendable to immersion lithography. In fact, the water generally helps by turning the image saddle into a local peak. However, mask feature sizes will shrink with increasing NA, where the minimum feature of the four-phase grating is:

$$P = \frac{M * \lambda}{4 * \sigma_C * NA}$$

Furthermore, various projection printing tool effects must be considered. Lens aberrations, particularly asymmetric aberrations such as coma that produce an effective wavefront tilt across the pupil, are likely to add an unwanted field component to the image center. This component will be proportional to the sine of the tilt angle, resulting in lost signal of the desired component by the cosine of the tilt angle. However, in a modem tool with a Strehl ratio of 0.975, this angle is on the order of 15° and since intensity is the square of electric field, this effect will likely be small. Finally, tool illumination conditions such as across field dose imbalance and local source variations should be addressed. These effects, even when severe, should be negligible since the measurement is solely based on the relative flux measurements from the six analyzers in one polarimeter. Thus absolute dose is not of concern. It is noted, that depending on the illumination condition being measured, this technique may require very high exposure doses (or, likewise, multiple sequential exposures).

In Summary, a method has been presented to monitor polarization in high-NA and immersion projection printing. A series of phase shifting test mask patterns have been derived from basic principles and, when properly calibrated, are sufficient to monitor polarization of any arbitrary illumination scheme. Simulated practical examples have shown this technique likely to monitor polarization in resist with a sensitivity of over 1.5 percent of the clear field per percent change in polarization state for on-axis illumination, or 0.75 percent for off-axis illumination. Potential limiting factors have been discussed, concluding that proper characterization of the test reticle is sufficient to alleviate concerns such as mask topography effects, mask making limitations, and tool imperfections.

Attached hereto and incorporated into the application is an appendix of supplemental information verifying the invention.

What is claimed is:

1. A method of monitoring polarization balance of illumination in high NA and immersion printing systems comprising the steps of:
   a) placing a set of phase shift mask patterns in the optical path of the system, the mask patterns scattering light into high angle spatial frequencies each creating a central image intensity based on proximity effects that is dependent on the local state polarization, and
   b) calibrating, measuring and comparing the intensity at the center of the pattern images to determine the state of polarization of the illumination incident upon the mask.

2. The method of claim 1 wherein step a) includes use of a series of phase shift mask patterns derived from the proximity effect found in high numerical projection printing systems, whereby the pattern maximizes the proximity effect spill-over to the center of the pattern, producing electric field that is oriented normal to the image plane and dependent on only one particular polarization component.

3. The method of claim 2 wherein the phase shift monitor is two phase and in step b) linear polarization balance from on-axis illumination is determined.

4. The method of claim 2 wherein the phase shift monitor is four phase and in step b) circular polarization balance from on-axis illumination is determined.

5. The method of claim 2 wherein the phase shift monitor is four phase, resembling the on-axis monitors but multiplied by a linear phase progression, and in step b) linear and circular polarization balance from off-axis illumination is determined.

6. A method of monitoring polarization balance of illumination in high NA and immersion printing systems comprising the steps of:
   a) placing a radial phase grating mask pattern in the optical path of the system, the mask pattern scattering light into high angle spatial frequencies to create central image intensity dependence on local state polarization, and
   b) calibrating, measuring and comparing the intensity at the center of the pattern images to determine the state of polarization of the illumination incident upon the mask.

7. The method of claim 6 wherein step a) includes use of periodic alternating phase radial arrays.

8. The method of claim 7 wherein the radial phase grating is two phase and in step b) linear polarization balance from on-axis illumination is determined.

9. The method of claim 7 wherein the radial phase grating is four phase and in step b) polarization balance from off-axis illumination is determined.

* * * * *